United States Patent [19]
Tohya et al.

[11] Patent Number: 5,978,231
[45] Date of Patent: Nov. 2, 1999

[54] PRINTED WIRING BOARD WITH INTEGRATED COIL INDUCTOR

[75] Inventors: Hirokazu Tohya; Shiro Yoshida; Yuzo Shimada, all of Tokyo, Japan

[73] Assignee: NEC Corporation, Tokyo, Japan

[21] Appl. No.: 09/082,800

[22] Filed: May 21, 1998

[30] Foreign Application Priority Data

May 22, 1997 [JP] Japan .................................. 9-132202
Sep. 18, 1997 [JP] Japan .................................. 9-253519

[51] Int. Cl.⁶ ............................... H05K 7/06; H05K 9/00
[52] U.S. Cl. ..................... 361/782; 361/783; 361/818; 333/12; 333/181; 336/200; 174/262
[58] Field of Search ........................... 361/734, 748–751, 361/764, 765, 762, 763, 766, 777–779, 780, 782, 783, 793, 794, 795, 816, 818, 820, 821, 792; 333/12, 181, 182, 246, 247; 336/200; 257/728; 439/941; 343/700 MS, 702; 174/255–258, 260–262, 264, 266

[56] References Cited

U.S. PATENT DOCUMENTS

| | | | |
|---|---|---|---|
| 4,984,146 | 1/1991 | Black et al. | 363/44 |
| 5,055,816 | 10/1991 | Altman et al. | 336/200 |
| 5,132,650 | 7/1992 | Ikeda | 333/181 |
| 5,479,695 | 1/1996 | Grader et al. | 29/602.1 |

FOREIGN PATENT DOCUMENTS

| | | |
|---|---|---|
| 4229076 | 8/1992 | Japan . |
| 7-263755 | 10/1995 | Japan . |
| 9139573 | 5/1997 | Japan . |

*Primary Examiner*—Leo P. Picard
*Assistant Examiner*—John B. Vigushin
*Attorney, Agent, or Firm*—Sughrue, Mion, Zinn, Macpeak & Seas, PLLC

[57] ABSTRACT

An insulative magnetic layer is disposed between a power source conductor layer and a ground conductor layer of a printed-wiring board. Two pieces of conductors are formed by cutting out a part of the power source conductor layer. Another two pieces of conductors are formed by cutting out a part of the ground conductor layer. The former conductors and the latter conductors are connected by five viaholes. A spiral coil inductor of a spiral form is formed in this way. This inductor has the strengthened inductance owing to the insulative magnetic layer provided therein.

20 Claims, 17 Drawing Sheets

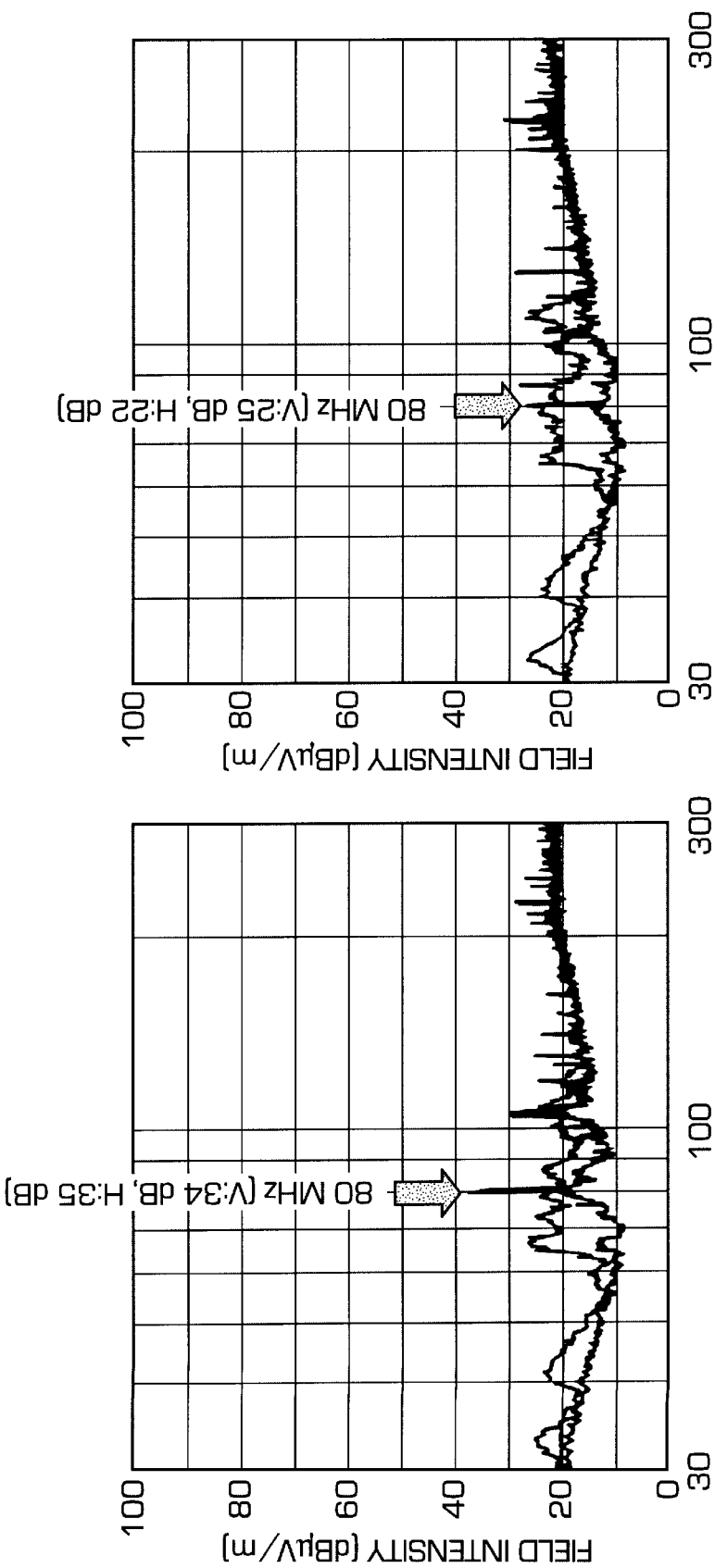

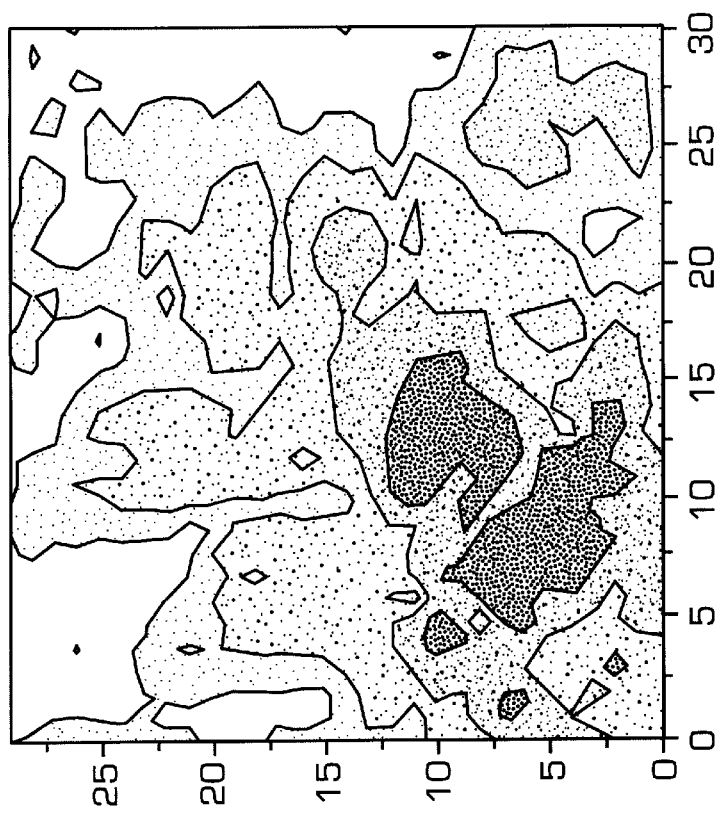
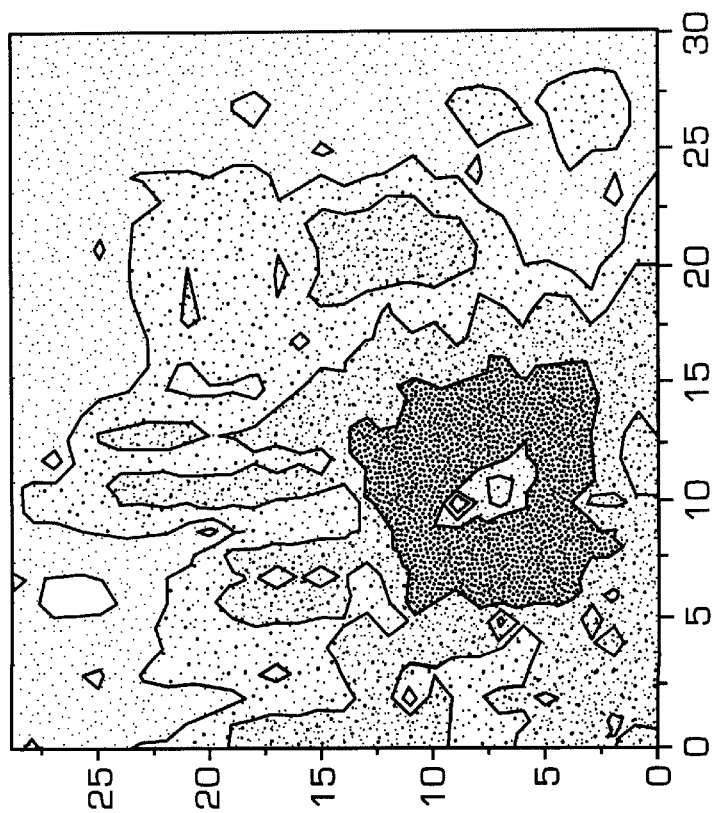
FIG. 15B
FIG. 15A

PRINTED WIRING BOARD WITH INTEGRATED COIL INDUCTOR

BACKGROUND OF THE INVENTION

1. Field of the Invention:

The present invention relates to a printed-wiring board, more particularly to a printed-wiring board comprising at least one electronic circuit and a substrate having two or more conductor layers for mounting said at least one electronic circuit.

2. Description of the Prior Art:

It is well known that a printed-wiring board mounted with a circuit element such as a transistor, an IC or an LSI often generates an electromagnetic noise, and hence a failure is sometimes caused in an electronic apparatus itself which has the built-in printed-wiring board or in other related electronic apparatus.

Among causes which generate the failure of the electronic apparatus of this like, the cause of particular large weight is a conductive or a radioactive electromagnetic wave produced by a current (a sneak current) which flows through the parasitic capacity or the parasitic mutual inductance of a circuit, called a common mode phenomenon. Since the generation mechanism of the electromagnetic wave of this kind is complex, an effective countermeasure near the failure generation source which is considered most effective has not been established. Therefore, a conventional countermeasure has been to control the conduction or the radiation of the electromagnetic wave by electromagnetically shielding the whole electronic apparatus with a metallic cover and providing a common-mode choke coil or core for the cable outwardly extending from the apparatus. On the other hand, with reference to the printed-wiring board of the conventional type, as shown in FIG. 2, high frequency capacitors C1–Cn are often connected between power supply terminals 3a–3n and ground terminals 4a–4n of electronic circuits Z1–Zn such as the IC, LSI (hereinafter simply called an electronic circuit) connected respectively to power supply line 1 which corresponds to power source conductor layer 1 and grounding line 2 which corresponds to ground conductor layer 2 of the printed-wiring board. The purpose of this arrangement is to flow the high frequency current, which flows in power supply line 1 accompanying the high frequency operation of electronic circuits Z1–Zn, in high frequency capacitors C1–Cn to decrease (that is, filtering) the high frequency fluctuation of the power source terminal voltage and to restrict the coupling (that is, decoupling) with other electronic circuit sharing power supply line 1. However, in particular, for effectively reducing the fluctuation of the power supply voltage, the conventional printed-wiring board is structured, as shown in FIG. 1, with power source conductor layer 1 made of all flat plate having no wiring in order to lower the impedance of the power supply line. The conventional printed wiring board is structured, as shown in FIG. 1, with insulative board layers 6, which are, e.g., typical resin substrates.

The above conventional printed-wiring board has a problem that a circuit designer can not control the high frequency current which flows in the power supply line accompanying the high frequency operation of said electronic circuit.

In other words, when the power conductor layer is made of a flat plate over the whole area without having wiring, the impedance of the power supply line is small, and hence even if a high frequency capacitor is connected between the power source terminal and the ground terminal of the electronic circuit, it is hard to control the high frequency power source current which flows out to the power supply line, and resultantly the high frequency power source current flows in the decoupling capacitor disposed in the vicinity of other electronic circuits which share the power supply line. Therefore, the analysis of the high frequency power source current with reference to the whole printed-wiring board is very difficult and hence it is unable to strictly select the decoupling capacitor to be used for each electronic circuit.

Further, the distribution of the high frequency power source current on the whole printed-wiring board is very complex. Depending on the arrangement of electronic circuits-on the printed-wiring board or on the operation state of the electronic circuits even if they are in the same arrangement, the high frequency power source current distributes in such a manner to form a large loop, having the probability of introducing the problem of electromagnetic radiation or immunity.

For example, as shown in FIG. 2, electronic circuits Z1 (a large current), Z2 (a medium current) and Zn (a small current) for different high frequency power source currents are connected respectively to both power supply line 1 and ground line 2. Mainly from the mounting and the cost restrictions, capacitors C1, C2 and Cn of capacitance corresponding to respective high frequency power source currents (large capacitance for Z1, medium capacitance for Z2, small capacitance for Z3) are connected to respective electronic circuits. When the electronic circuits on the printed-wiring board operate in this state, since capacitor Cn of small capacitance, connected between the power source terminal and the ground terminal of electronic circuit Zn for small high frequency power source current, has the impedance larger than that of other capacitors, the high frequency power source current of electronic circuit Zn flows into capacitor C2 of medium capacitance (having small impedance compared to that of Zn) connected between the power source terminal and a ground terminal of electronic circuit Z2 for a medium high frequency power source current, or into capacitor C1 of large capacitance connected between the power source terminal and the ground terminal of electronic circuit Z1 for a large high frequency power source current. Further, if the capacitors are of the same type, the frequency characteristic of the impedance becomes different according to each capacitance, and the impedance of the capacitor of small capacitance tends to become smaller than the impedance of the capacitor having the larger capacitance, in the region where the number of the high frequency exceeds some value. Therefore, when viewed in the broad frequency band, electric currents flow to and fro in a complicated way between electronic circuits on the printed-wiring board. As a result, the loop made by the high frequency power source current becomes large or the high frequency current of the common mode is made to flow into such as the cable connected from one printed-wiring board to another printed-wiring board, thereby increasing the conductive or radioactive electromagnetic waves.

These phenomena have caused the electromagnetic interference between the electronic apparatus, that is, EMC problem. Further, for example, high frequency power source voltage fluctuation with reference to one electronic circuit on the printed-wiring board sometimes becomes an issue. In this case, even if the capacitance of a decoupling capacitor in the vicinity of the electronic circuit is increased, it is not effective because the more the capacitance is increased, the more the high frequency power source currents of other electronic circuits flow into the circuit, and consequently it becomes hard to decrease the high frequency power source voltage fluctuation with the probability of failing in securing the high frequency operation of the electronic circuit.

Further, when the latest IC/LSI is used in a logical unit which operates at a low frequency, for preventing the generation of the unnecessary conductive or radioactive electromagnetic waves to be caused due to excessively fast rise time or fall time of a rectangular wave signal of the IC/LSI, sometimes a high frequency filter is inserted in the circuit to slow the rise time and the fall time of the rectangular wave signal of the IC/LSI. However, when the high frequency filter of this like is newly added as parts, the high density mounting efficiency on the printed-wiring board is disadvantageously affected.

Therefore, with the conventional printed-wiring board, it becomes necessary to electromagnetically shield the whole electronic apparatus with metal foil, as described above, to protect against the EMC problem and concurrently control the conduction of the electromagnetic waves by attaching a common-mode choke coil or core for the cable extending outwardly of the apparatus. Still further, with reference to the problem which hinders the high frequency operation of the IC/LSI, it is necessary to meet the problem by mounting capacitors of a required number or more on the printed-wiring board to control the high frequency power source voltage fluctuation of the whole wiring board.

SUMMARY OF THE INVENTION

An object of the present invention is to provide a printed-wiring board which can remarkably reduce the generation of an electromagnetic noise, largely increase the resistance to an extraneous electromagnetic noise, and allows the smooth high frequency operation of electronic circuits such as an IC, LSI to be mounted.

Another object of the present invention is to provide a printed-wiring board for which a circuit designer can control the high frequency power source current of each electronic circuit such as an IC, LSI mounted on the wiring board.

The printed-wiring board of the present invention comprises at least one electronic circuit and a substrate for mounting the electronic circuit. The substrate comprises two or more conductor layers and a spiral coil inductor.

A plurality of conductors are formed by cutting a part of two conductor layers disposed opposite to each other from among the conductor layers. The spiral coil inductor is composed of this plurality of conductors and viaholes vertically connecting between said plurality of conductors. Further, on a part or the whole area between two conductor layers disposed facing each other for composing the spiral coil inductor, an insulative magnetic material is disposed in layers.

It is allowable to use a structure such that a capacitor is connected between a power supply side terminal and a ground side terminal of the electronic circuit, one end of the spiral coil inductor is connected to the power source terminal of the electronic circuit and the other end thereof is connected to the power source conductor layer. In this case, the spiral coil inductor constitutes a structural element of a decoupling circuit while discharging a large decoupling function with a small space.

It is allowable to use a structure such that a high frequency filter is connected between an output terminal of one electronic circuit and an input terminal of another electronic circuit, the high frequency filter including the spiral coil inductor as a structural element thereof. In this case, when the latest IC/LSI is used as the electronic circuit which operates at a low frequency, even if the rise time or the fall time of a rectangular wave signal of the IC/LSI is too fast, unnecessary conductive or radioactive electromagnetic waves are not generated.

A part of the ground conductor layer and the power source conductor layer disposed opposite to each other may be used as two layers of conductor layers which constitute a spiral coil inductor. In this case, the spiral coil inductor is sometimes composed without using the additional number of conductor layers compared with the conventional case.

Two layers of conductor layers used for composing the spiral coil inductor are each a part of the power source conductor layer and can have at least one layer of a ground layer outside of two conductor layers. In this case, unnecessary conductive or radioactive electromagnetic waves are not generated and the distortion of the signal waveform becomes minimum.

Futhermore, it may take a structure having a viahole vertically connecting between two signal conductor layers while penetrating two conductor layers, and having another viahole connected to two ground conductor layers at both ends thereof being disposed in the proximity of the viahole. Also in this case, unnecessary electromagnetic waves are not generated and the signal waveform distortion becomes minimum.

As an insulative magnetic material, a mixture of a ferrite fine powder of one of an Ni-Zn group, a Mn-Zn group, Sendust or a Li group and an insulative solvent may be used. Also as the insulative solvent, epoxy group insulative solvent can be used.

Further, the insulative magnetic material can be formed of a plurality of magnetic films, with insulation coating on both sides of the insulative magnetic material. It is also possible to use a multilayer band of amorphous magnetic film as the plurality of magnetic films.

The above and other objects, features and advantages of the present invention will become apparent from the following description with reference to the accompanying drawings which illustrate examples of the present invention.

BRIEF DESCRIPTION OF THE DRAWING

FIG. 13A is a graph showing measured results of the radiation field intensity in a radio wave darkroom with reference to the conventional example of the printed-wiring board, FIG. 13B is a graph showing measurement results similar to that of FIG. 13A prepared with reference to the embodiment of the printed-wiring board of the present invention, FIG. 15A is a measurement chart showing the magnetic field distribution in the vicinal area with reference to the conventional example of the printed-wiring board, FIG. 15B is a measurement chart showing the magnetic field distribution in the vicinal area with reference to the embodiment of the printed-wiring board of the present invention.

DETAILED DESCRIPTION OF THE PREFERRED EMBODIMENTS

Figure 3:
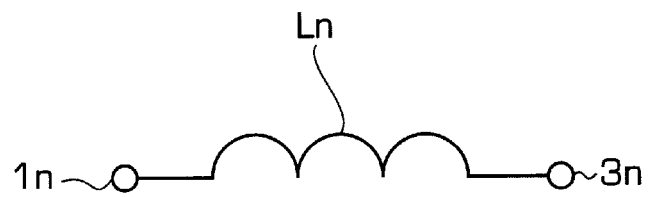
FIG. 3 is a circuit symbol diagram of a spiral coil inductor which constitutes a primary part of an embodiment of the printed-wiring board of the present invention.
Figure 4A:
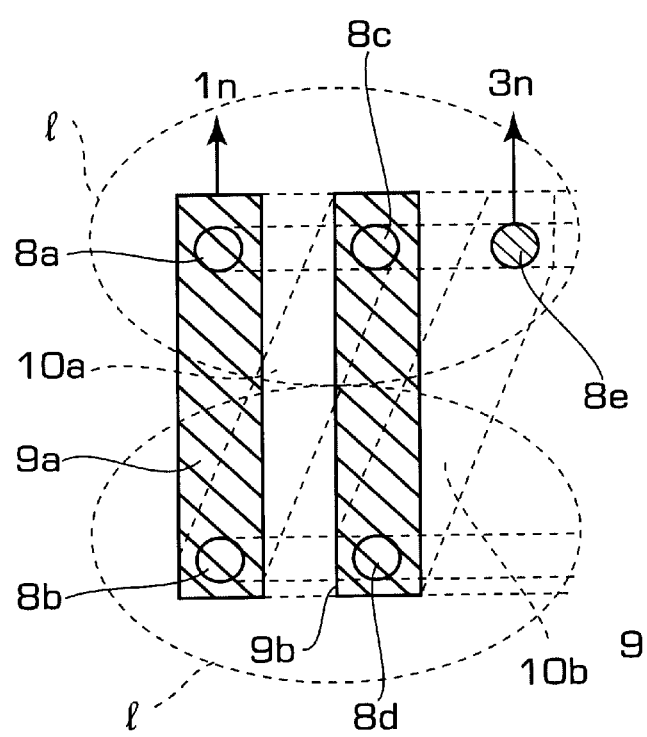
FIG. 4A is a plan view of a first embodiment of the spiral coil inductor Ln of FIG. 3.
Figure 4B:
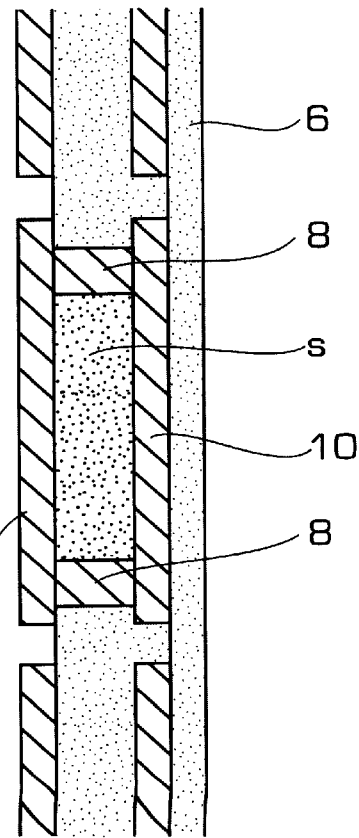
FIG. 4B is a longitudinal section of FIG. 4A.

FIG. 3 shows circuit symbols of a spiral coil inductor which is a primary part of a printed-wiring board of the present invention, FIG. 4A and FIG. 4B show a plan view and a section of the spiral coil inductor Ln of a first embodiment of the printed-wiring board of FIG. 3, respec-tively. Terminal numbers $1n$ and $3n$ in the circuit symbols of FIG. 3 correspond to terminal numbers $1n$ and $3n$ of the plan view of FIG. 4A, respectively. In the first embodiment of the printed-wiring board, a part of two conductor layers 9, 10 disposed opposite to each other are cut out to produce a plurality of conductor layers $9a$, $9b$ and $10a$, $10b$. In the whole region between two conductor layers $9a$ and $10a$, $9b$ and $10b$ oppositely disposed to each other, there are provided insulative magnetic material 7 disposed in layers. By using viaholes $8a$, $8b$, $8c$ and $8d$ connecting between conductor layers $9a$ and $10a$, $9b$ and $10b$, and constructing as shown in perspective views of FIG. 4A, FIG. 4B and FIG. 5, spiral coil inductors each being an inductor of a spiral form are produced in the printed-wiring board.

Figure 6A:
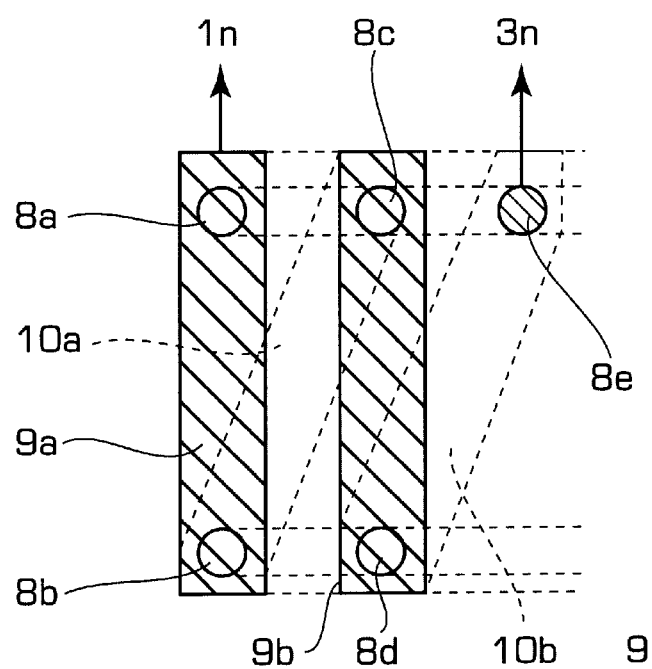
FIG. 6A is a plan view of a second embodiment of the spiral coil inductor Ln of FIG. 3.
Figure 6B:
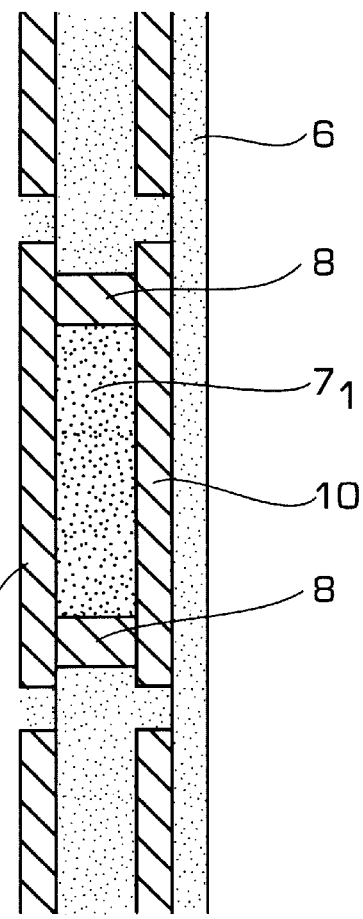
FIG. 6B is a longitudinal section of FIG. 6A.

FIGS. 6A and 6B show a plan view and a longitudinal section of the spiral coil inductor Ln of a second embodiment of the printed-wiring board of FIG. 3, respectively. In the printed-wiring board of the second embodiment, as shown in FIGS. 6A and 6B, the structure is similar to that of the first embodiment except that insulative magnetic material $7_1$ is disposed in layers to form the spiral coil inductor in a partial region between two layers of conductors $9a$ and $10a$, $9b$ and $10b$ disposed facing each other.

In the printed-wiring board of the first and the second embodiments, the spiral coil inductor is formed by using two layers of conductor layers. The inductance (L) of this coil is obtained in the following equation.

$$L = \frac{\mu_0 \mu_s n^2 s}{l} \text{ (henry)} \quad (1)$$

where, $\mu_0$: permeability in the vacuum ($4 \pi 10^{-7}$),
$\mu_s$: relative magnetic permeability,
n: number of turns of spiral coil,
s: cross-sectional area of spiral coil (m$^2$),
l: mean magnetic path length of spiral coil (m), From this equation, it is understood that the inductance (L) is proportional to a square of the number of turns of the spiral coil.

For example, in case of composing a microstrip line in a well known meandering form, the microstrip line may take a structure (J.P.A. 236488/1995) in which the insulative magnetic material is disposed in layers on both sides of the conductor layer which constitutes the microstrip line, additionally providing ground conductor layers on both outsides of the magnetic material. However, in this case, the electrostatic coupling between the microstrip conductor layer and the neighboring ground conductor layer functions to control the impedance of the inductor. Therefore, even if the conductor length of the inductor is lengthened, when the wavelength of the current exceeds one half of the wavelength of the problematic high frequency current, characteristic impedance $Z_0$ of the transmission line on the lossless line is given by equation (2). Specifically, $Z_0$ becomes the constant impedance which is independent of the length of the conductor and the frequency of the applied current.

$$Z_0 = \sqrt{\frac{L}{C}} \text{ } (\Omega) \quad (2)$$

where, C: capacitance (F) between conductors oppositely disposed, interposing a dielectric,
L: inductance (H) of the microstrip line,.

Specifically, the insulative magnetic material generally shows relatively high permeability and also a relatively large dielectric constant. In the above equation (2), the value of C is proportional to the effective area and the dielectric constant of the conductors oppositely disposed, in other words, it is well known that C is proportional to the length of the conductor if the width of the conductor, the distance and the dielectric factor between the microstrip conductor layer and the ground conductor layer, are all constant. Similarly, with reference to the inductance when the microstrip is composed with one layer of the conductor in the same way as above in the meandering form, it is well known that the inductance is proportional to the length of the conductor if the width of the conductor and the effective permeability around the conductor are constant. Therefore, if the length of the conductor is prolonged, capacitance C and inductance L increase at the same rate, and hence characteristic impedance becomes always constant according to equation (2).

On the other hand, with the spiral coil inductor according to the present invention, since the inductance L is proportional to the square of the number of turns of the coil, the value of L becomes proportional to the square of the length of the conductor, if the width of the conductor is constant. Therefore, according to the structure of the present invention, even if the inductor is placed between, for example, ground conductor layers to obtain the stable characteristic and reduce the interference on the signal conductor layer which is caused by the generated magnetic field, with reference to the value of the inductance L of the spiral coil inductor, the upper limit of the impedance of the inductor is not limited by said equation (2) and can take the larger value. Further, the more the frequency increases, the more it becomes possible to get the larger impedance.

Although FIGS. 4A, 4B and FIGS. 6A, 6B show examples of the spiral coil inductor with the number of turns two, respectively, it is possible to get a large number of turns of the coil by increasing the number of conductors 9 and 10. In FIG. 4A, l represents a mean magnetic path length, s in FIG. 4B an effective sectional area. Now, these values are structurally settled, and when the number of turns n is determined, the inductance L can be obtained through said equation (1).

Figure 7:
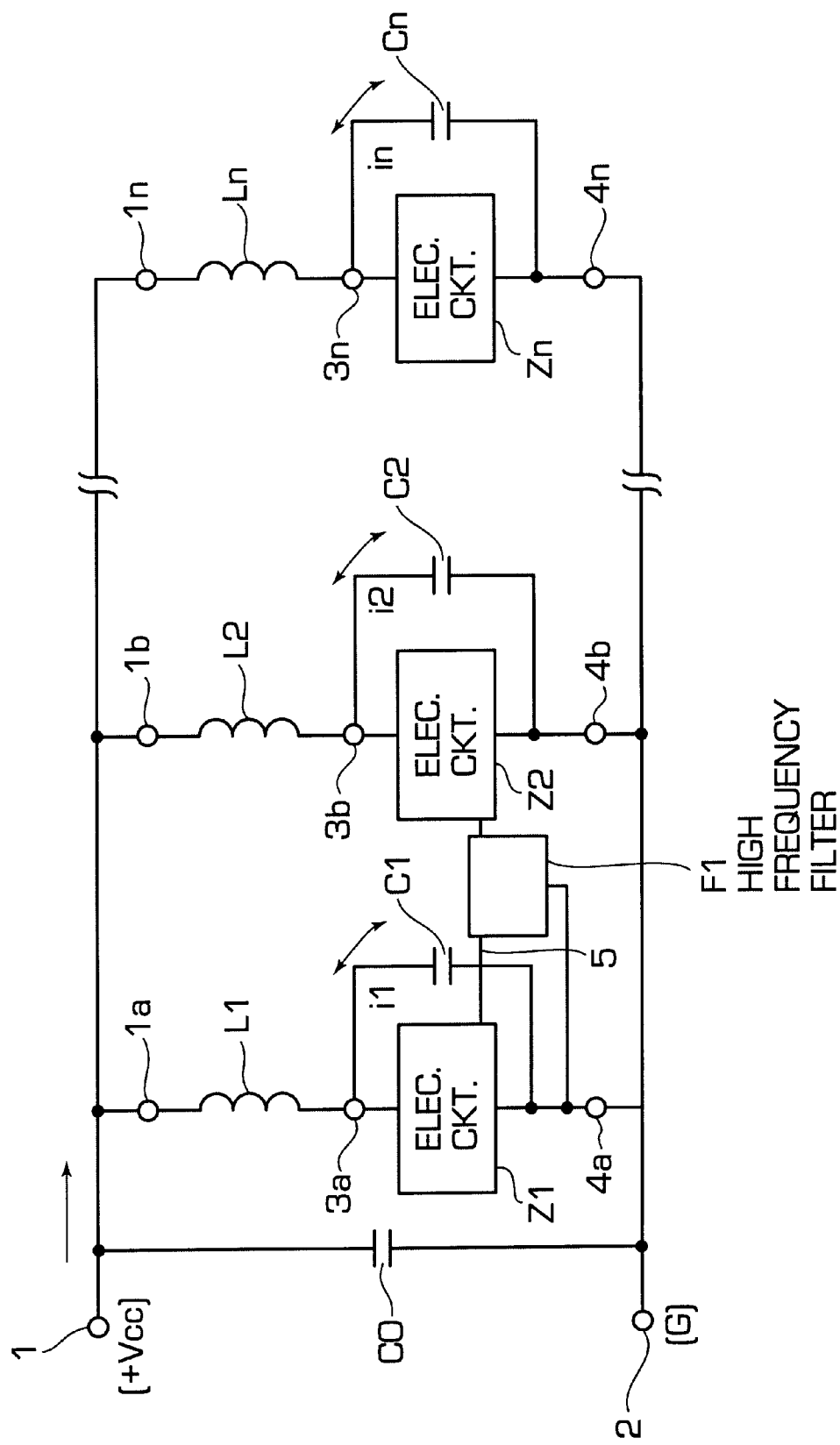
FIG. 7 is a circuit diagram showing an application example of the spiral coil inductor of FIG. 3.

FIG. 7 shows a circuit in which the spiral coil inductor formed in such a way as described above is applied as a power source decoupling circuit of electronic circuits Z1–Zn such as the IC, LSI which are mounted on the printed-wiring board and a part of a high frequency filter for prolonging the rise time or the fall time of the rectangular wave signal of the IC/LSI. In the printed-wiring board, one end of each of spiral coil inductors L1–Ln designed to have an appropriate characteristic is connected to a power source terminal of each of electronic circuits Z1–Zn, and each of the other ends is connected to power source conductor layer 1. Further, between power source terminals 3a–3n and ground terminals 4a–4n of electronic circuits, capacitors C1–Cn of the proper characteristic are selectively connected, respectively. The high frequency power source currents produced by the high frequency operation of electronic circuits Z1–Zn are effectively bypassed to respective capacitors, thereby controlling the high frequency power source currents which leak out to power source terminal 1. This means that the value of capacitors C1–Cn connected to electronic circuits Z1–Zn, respectively, can be determined independently through the optimum design for every capacitor. Further, by concurrently setting the dimension of each conductor of spiral coil inductors L1–Ln appropriately to get the resistance of a minute value, it becomes possible to control the fluctuation of the power source voltage of electronic circuits Z1–Zn to a minute value.

Now, high frequency filter F1 is connected between electronic circuits Z1 and Z2 of FIG. 7 by signal line 5. High frequency filter F1 is used for prolonging the rise time or the fall time of the rectangular wave signal of the IC/LSI, while having built-in spiral coil inductor Li as a structural element. When the spiral coil inductor is used in the high frequency filter, even if the latest IC/LSI is applied in a logical unit which is operated at a low frequency, it becomes possible to effectively control, in mounting, the generation of the unnecessary conductive or radioactive electromagnetic wave which may be caused due to an excessively short rise time or fall time of the rectangular wave signal of the IC/LSI.

Figure 8:
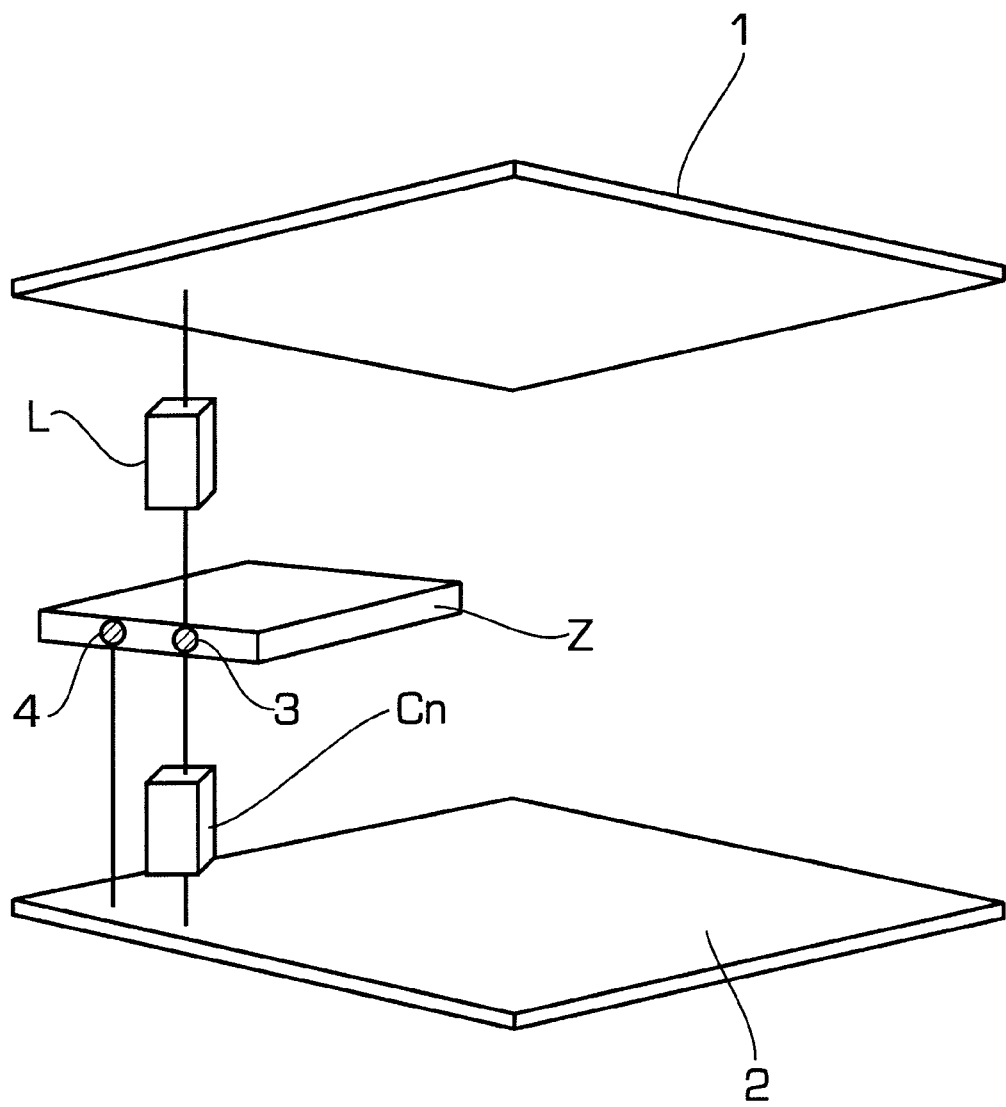
FIG. 8 is a perspective view of the spiral coil inductor of FIG. 3.

FIG. 8 illustrates a connection structure shown with reference to one unit of the power source decoupling circuit selected from among circuit diagrams shown in FIG. 7. In this figure, it is important to make the high frequency power source current flow in the circuit easily by preparing the length of the path as short as possible particularly from power source terminal 3 of electronic circuit Z to ground terminal 4 of electronic circuit Z through capacitor Cn and ground layer 2.

Figure 1:
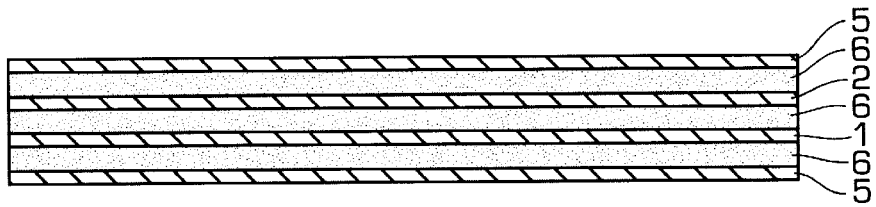
FIG. 1 is a longitudinal section of a conventional example of a printed-wiring board.
Figure 9:
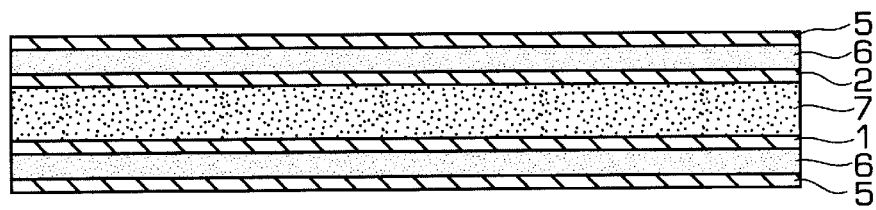
FIG. 9 is a longitudinal section of a four-layer printed-wiring board for constituting the spiral coil inductor of FIG. 3.

The printed-wiring board of FIG. 9 has four layers of conductor layers, the outer two layers serving as signal conductor layers 5, inner two layers serving as power source conductor layer 1 and ground conductor layer 2, respectively, and insulative magnetic substance 7 being disposed in layers between oppositely disposed power source conductor layer 1 and ground conductor layer 2.

In the printed-wiring board, the spiral coil inductor Ln is formed by using power source conductor layer 1 and ground conductor layer 2. As insulative magnetic substance 7, a mixture of an Ni-Zn group ferrite fine powder and an insulation solvent of such as an epoxy group, or a mixture of a Mn-Zn group ferrite fine powder and an insulation solvent of such as an epoxy group, or a mixture of a Li group ferrite fine powder and an insulation solvent of such as an epoxy group is used.

Figure 10:
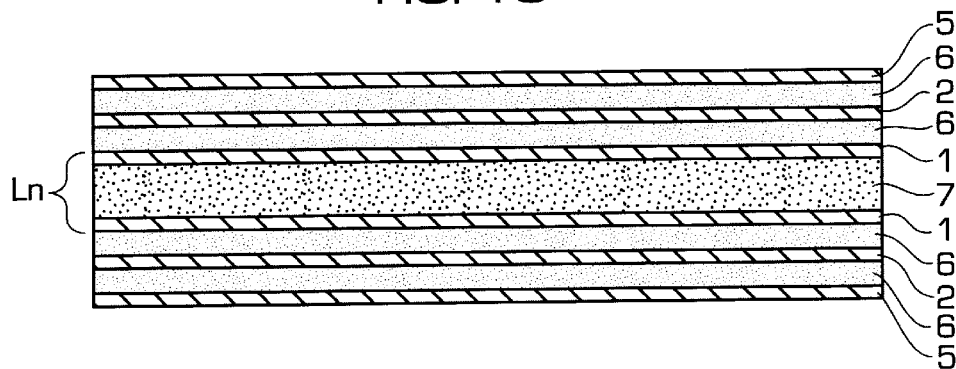
FIG. 10 is a longitudinal section of a six-layer printed-wiring board for constituting the spiral coil inductor of FIG. 3.

The printed-wiring board shown in FIG. 10 has six layers of conductor layers, the outermost two layers serving as signal conductor layers 5, the innermost two layers serving as power source conductor layer 1 while interposing insulative magnetic layer 7 and serving for forming the spiral coil inductor Ln. Two layers disposed outside both power source conductor layers 1 serve as ground layers 2, respectively. If the spiral coil inductor according to the present invention is formed in a part of oppositely disposed two layers of power source conductor layers 1 which belong to six layer printed-wiring board of this like, the structure of the spiral coil inductor is as described before.

Figure 11:
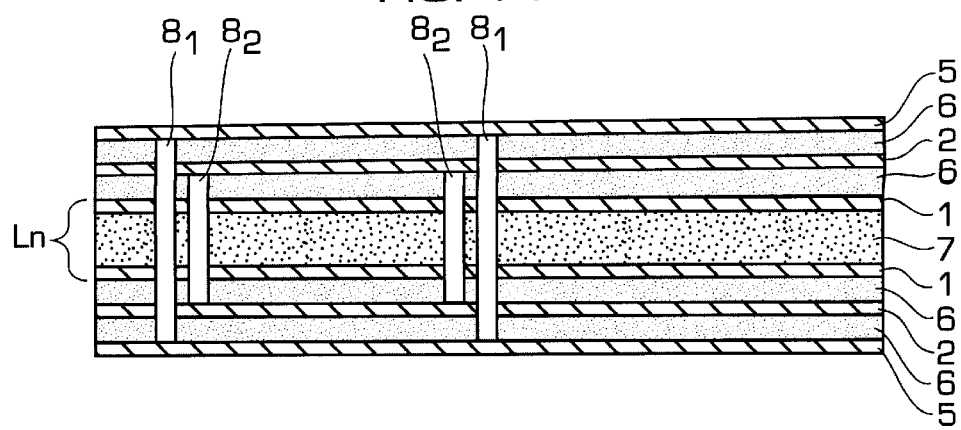
FIG. 11 is a longitudinal section of a six-layer printed-wiring board different from that of FIG. 10 and used for constituting the spiral coil inductor of FIG. 3.
Figure 2:
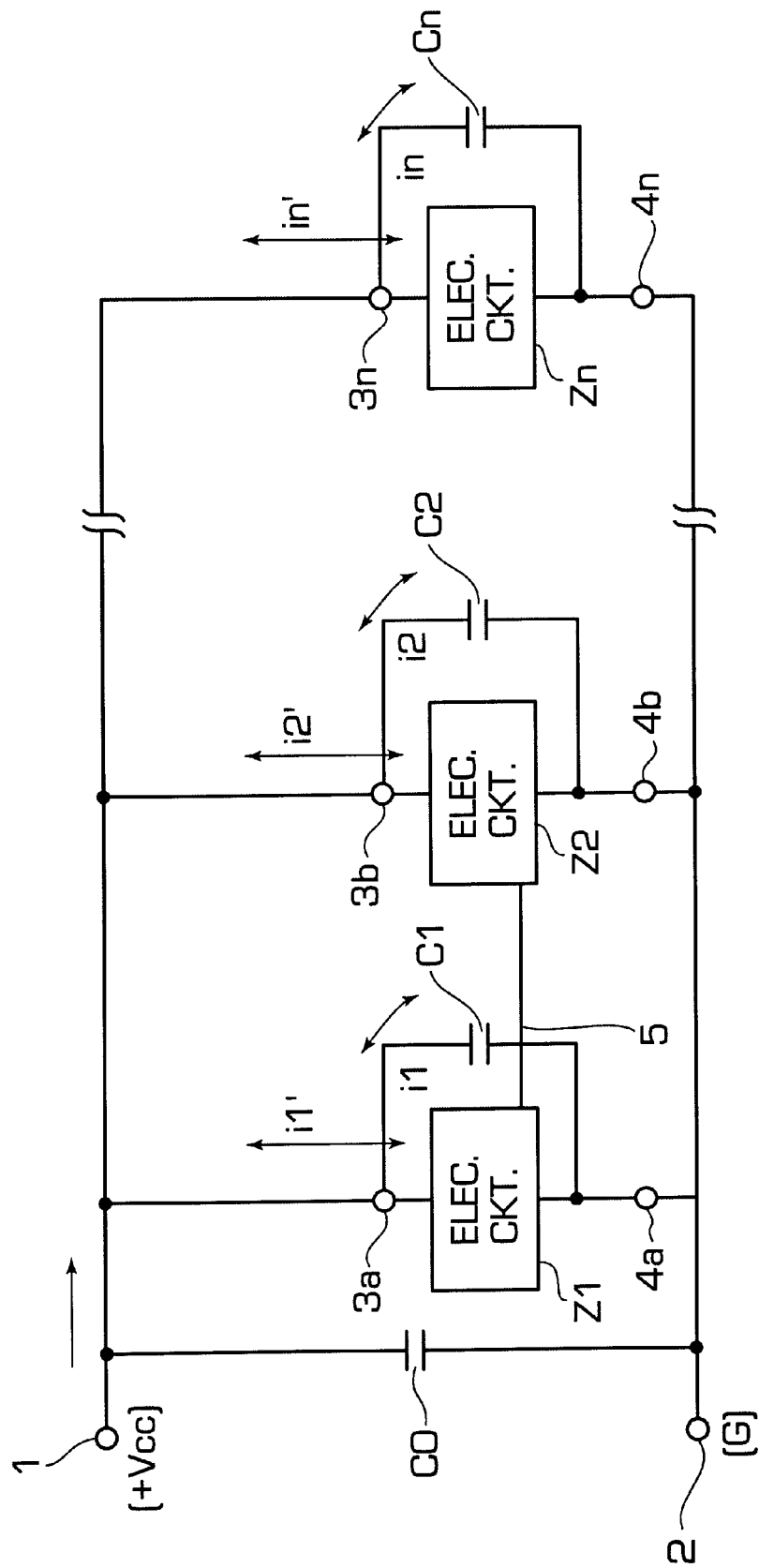
FIG. 2 is a circuit diagram including electronic circuits of the printed-wiring board of FIG. 1.

The printed-wiring board shown in FIG. 11 comprises two layers of power source conductor layers 1 disposed opposite to each other for composing a spiral coil inductor, two layers of ground conductor layers 2 disposed outside both power source conductor layers 1, respectively, and viaholes $8_1$ penetrating ground conductor layers 2 for vertically connecting between signal conductor layers, and further viaholes $8_2$ disposed near said viaholes $8_1$ being connected at both ends thereof to ground conductor layers 2. By constructing the printed-wiring board to this structure, with reference to viahole $8_1$ for vertically connecting between the signal conductor layers, the unbalance of the impedance which may be produced near magnetic layer 7 can be controlled.

Figure 12:
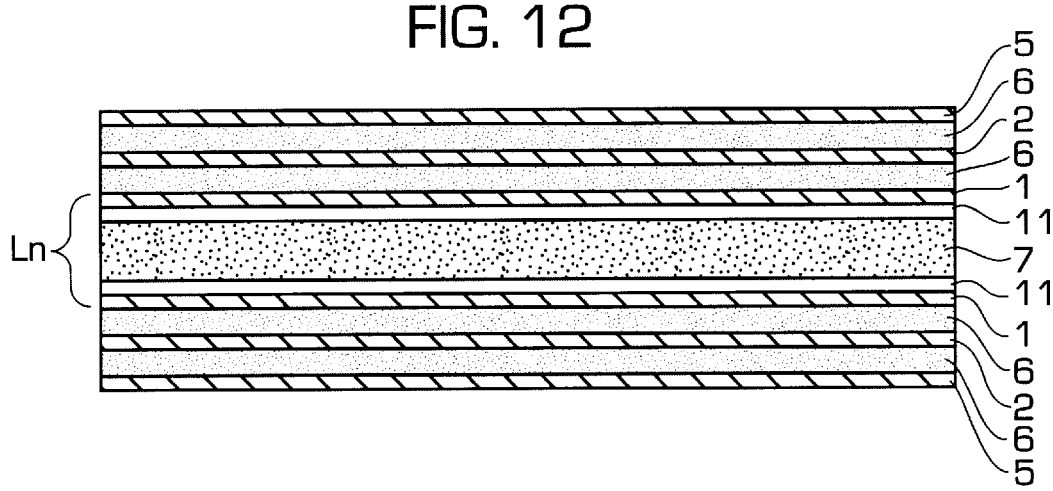
FIG. 12 is a longitudinal section of a six-layer printed-wiring board different from those of FIG. 10 and FIG. 11 and used for constituting the spiral coil inductor of FIG. 3.
Figure 14B:
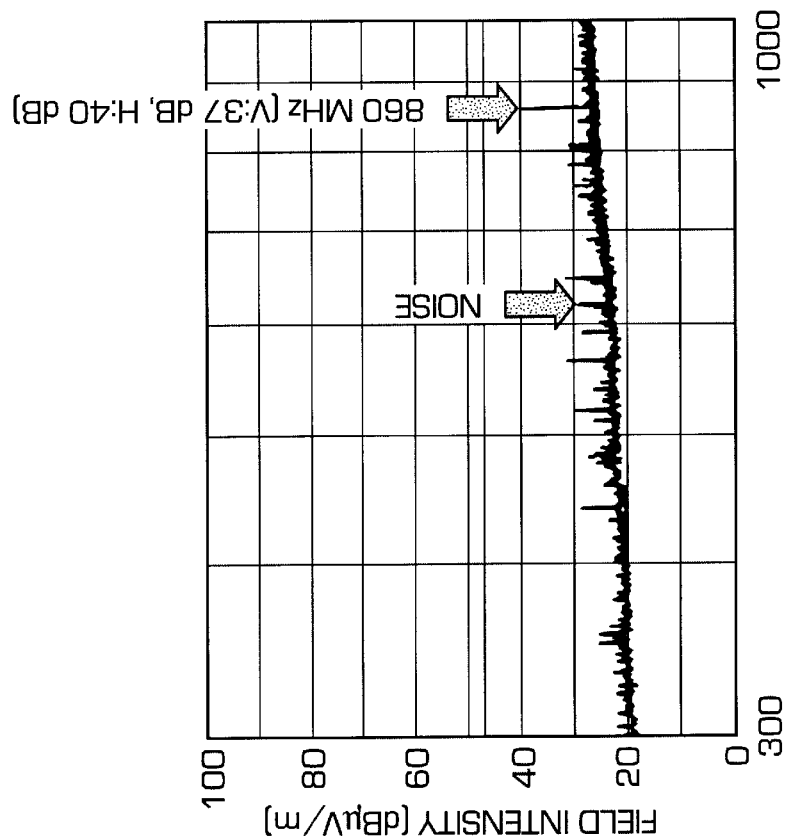
FIG. 14B is another graph showing the measurement result of FIG. 13B.
Figure 14A:
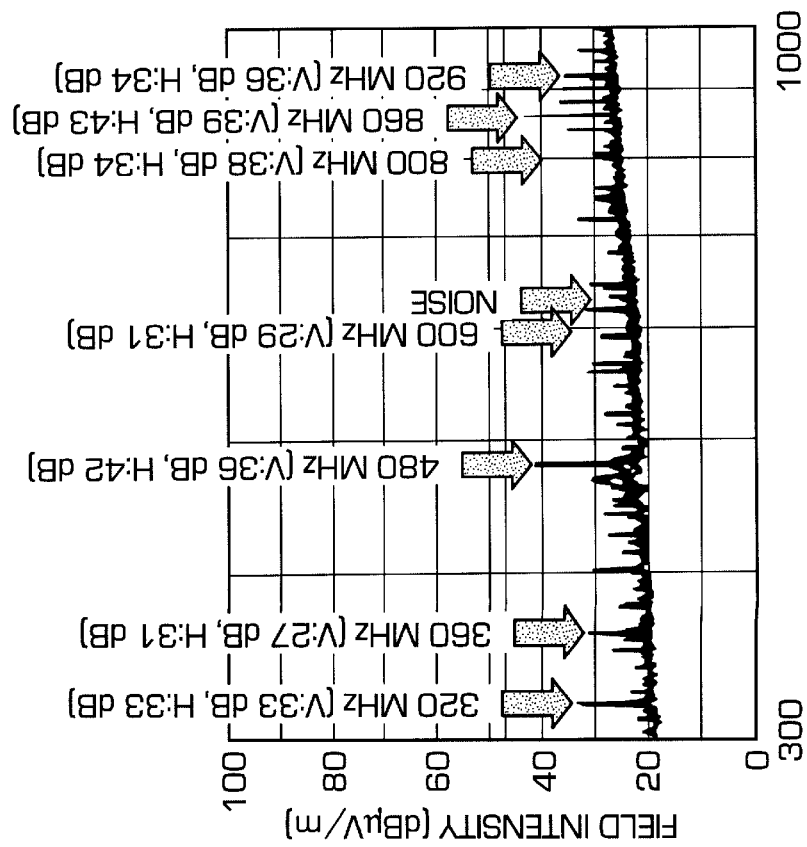
FIG. 14A is another graph showing the measurement result of FIG. 13A.

In the printed-wiring board shown in FIG. 12, a multilayer band of the amorphous magnetic foil is used as insulative magnetic material 7 disposed between two power source conductor layers. Insulation coating 11 is provided on both sides of the insulative magnetic material 7. As insulative magnetic material 7 to be disposed between conductor layers, it is of course possible to use other materials.

The printed-wiring board according to the present embodiment has a built-in spiral coil inductor Ln composed VCCI measuring method). Thus measured results and the measured results of the conventional example are shown in FIGS. 13A, 13B and FIGS. 14A, 14B, respectively. Further, the results of FIGS. 13A, 13B and FIGS. 14A, 14B are shown in table 1.

TABLE 1

| | Conventional example | | Embodiment | | Difference | |
|---|---|---|---|---|---|---|
| Frequency (MHz) | Vertical Polarization (dB μ V/m) | Horizontal Polarization (dB μ V/m) | Vertical Polarization (dB μ V/m) | Horizontal Polarization (dB μ V/m) | Vertical Polarization (dB μ V/m) | Horizontal Polarization (dB μ V/m) |
| 80 | 34 | 35 | 25 | 22 | −9 | −13 |
| 320 | 33 | 33 | (19) | (20) | −14 | −13 |
| 360 | 27 | 31 | (23) | (23) | −4 | −8 |
| 480 | 36 | 42 | (24) | (26) | −12 | −16 |
| 600 | 29 | 31 | (24) | (23) | −5 | −8 |
| 800 | 38 | 34 | (29) | (27) | −9 | −7 |
| 860 | 39 | 43 | 37 | 40 | −2 | −3 |
| 920 | 36 | 34 | (27) | (29) | −9 | −5 | by disposing insulative magnetic material in layers partially or wholly between two conductor layers facing each other, so that the large inductance can be obtained with a reduced space.

A decoupling circuit composed by using said spiral coil inductor Ln can produce large decoupling effect with a reduced space.

A high frequency filter composed by using said spiral coil inductor can prevent the generation of unnecessary conductive or radioactive electromagnetic waves which are caused by excessively shortened rise time or fall time of a rectangular wave signal of the IC/LSI, particularly when it is employed in the logical unit which operates at a low frequency.

Now, the spiral coil inductor Ln, composed of a power source conductor layers and a ground conductor layer disposed opposite to each other and viaholes, has a number of layers not more than that of a conventional multilayer printed-wiring board, therefore it is advantageous to use from the viewpoint of cost when a small amount of the spiral coil inductor is required.

Since a mixture of metal or a ferrite fine powder and an insulation solvent of such as an epoxy group is used as the magnetic material for composing the spiral coil inductor, the influence on the manufacturing process of the printed-wiring board can be kept to a lower level.

When magnetic film is used as the magnetic material for composing the spiral coil inductor, the manufacturing process of the magnetic layer can be simplified.

Next, a test result will be described with reference to a concrete example of the printed-wiring of the present embodiment.

Figure 5:
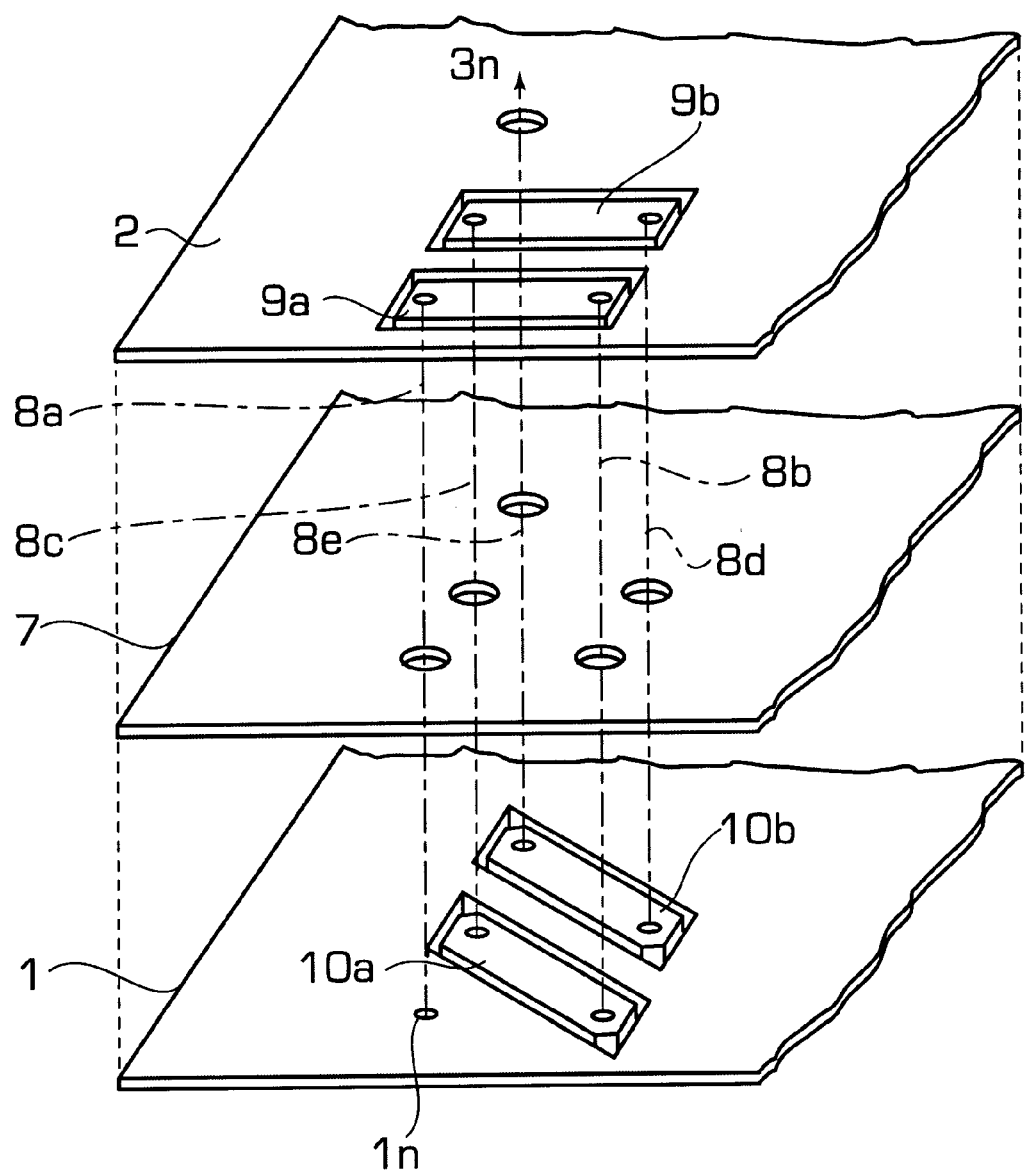
FIG. 5 is a perspective view of the spiral coil inductor Ln of FIG. 4A.

As shown in FIGS. 3, 4 and 5, the printed wiring board (embodiment) to be tested is prepared by forming a spiral coil, using the wiring and a viahole, between a power source layer and an opposite layer both made of a flat plate, disposing a mixture of an Ni-Zn group ferrite fine powder and an insulation solvent of such as an epoxy group between both layers in layer form for the purpose of augmenting the inductance. Further, this printed-wiring board has a strengthened decoupling circuit as shown in FIG. 7. By placing an electronic apparatus (EWS: engineering work station) which uses this printed-wiring board in an electronic wave dark room, a tester measured the radiation field intensity (by In the table, data in parentheses each represents a noise level. As shown in table 1, by comparing an original substrate (described as "conventional" in the table) having a conventional power source layer made of a flat plate as a whole and the embodiment of the present invention, it is known that the spectra of the multiplied waves (80 MHz, 320 MHz, 480 MHz, 600 MHz, 800 MHz, 860 MHz, 920 MHz) of the clock frequency (40 MHz) are more clearly controlled in the embodiment than in the original substrate, and the reduction effect of the radiation field can be recognized (spectra other than 80 MHz and 860 MHz are controlled to the background noise level).

Further, in FIGS. 15A, 15B, measurement results of the vicinity magnetic field distribution are shown, obtained by scanning a magnetic field measuring probe on the substrate of the conventional example and the embodiment (EWS), respectively. Although the measurement was performed for all the frequencies which showed the remarkable control effect in said radiation field intensity measurement, here the case of 80 MHz twice the clock frequency is shown as an example. In the distribution charts of FIGS. 15A, 15B, a dark color portion represents the place where the magnetic field intensity is strong, and as the color changes becomes lighter, it represents that the magnetic field intensity decreases. In the dark color portion at the lower left part of the distribution chart, there exists a substrate mounted with a CPU and a large LSI which are noise generation sources. By comparing the distribution chart of FIG. 15A and FIG. 15B, it is understood that the magnetic field intensity of the periphery portion such as an upper part and a right side of FIG. 15B of the embodiment is weak (diffusion to the periphery is reduced). This means that the high frequency power source currents from the CPU and the large LSI which are the noise generation sources are effectively bypassed to the ground conductor by the decoupling capacitor disposed in the vicinity, thereby decreasing the wraparound of the currents to other electronic circuits. In other words, it shows that the decoupling effect has been increased due to the isolation realized by the individual LSI/IC unit.

It is confirmed in the vicinity magnetic field distribution chart of FIG. 15B that the present embodiment has succeeded to increase the decoupling effect thereby decreasing the wraparound of the high frequency power source current to other circuit. Particularly, it is recognized that the diffusion to the upper right portion is decreased. It is to be noted that a similar tendency is confirmed with other frequencies.

Figure 16:
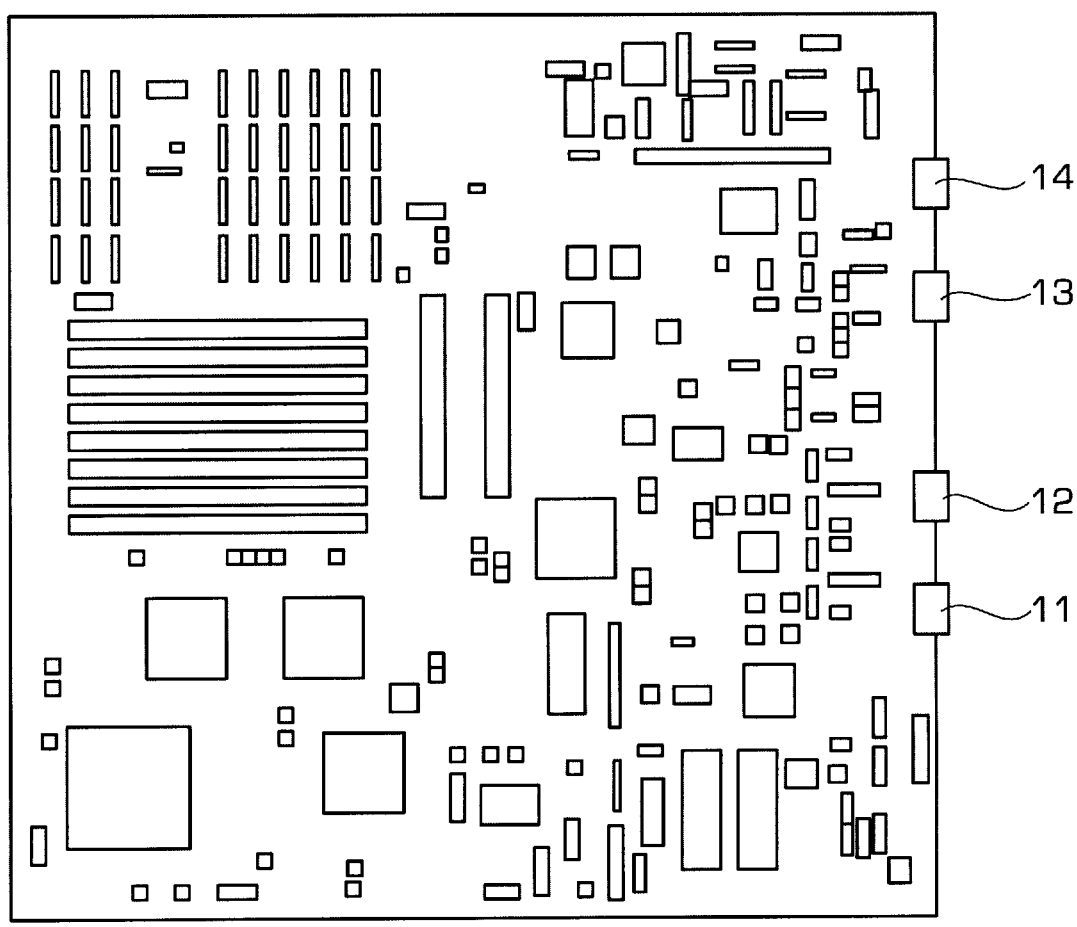
FIG. 16 is a plan view showing the arrangement of I/O connectors of the embodiment of the printed-wiring board of the present invention.
Figure 17:
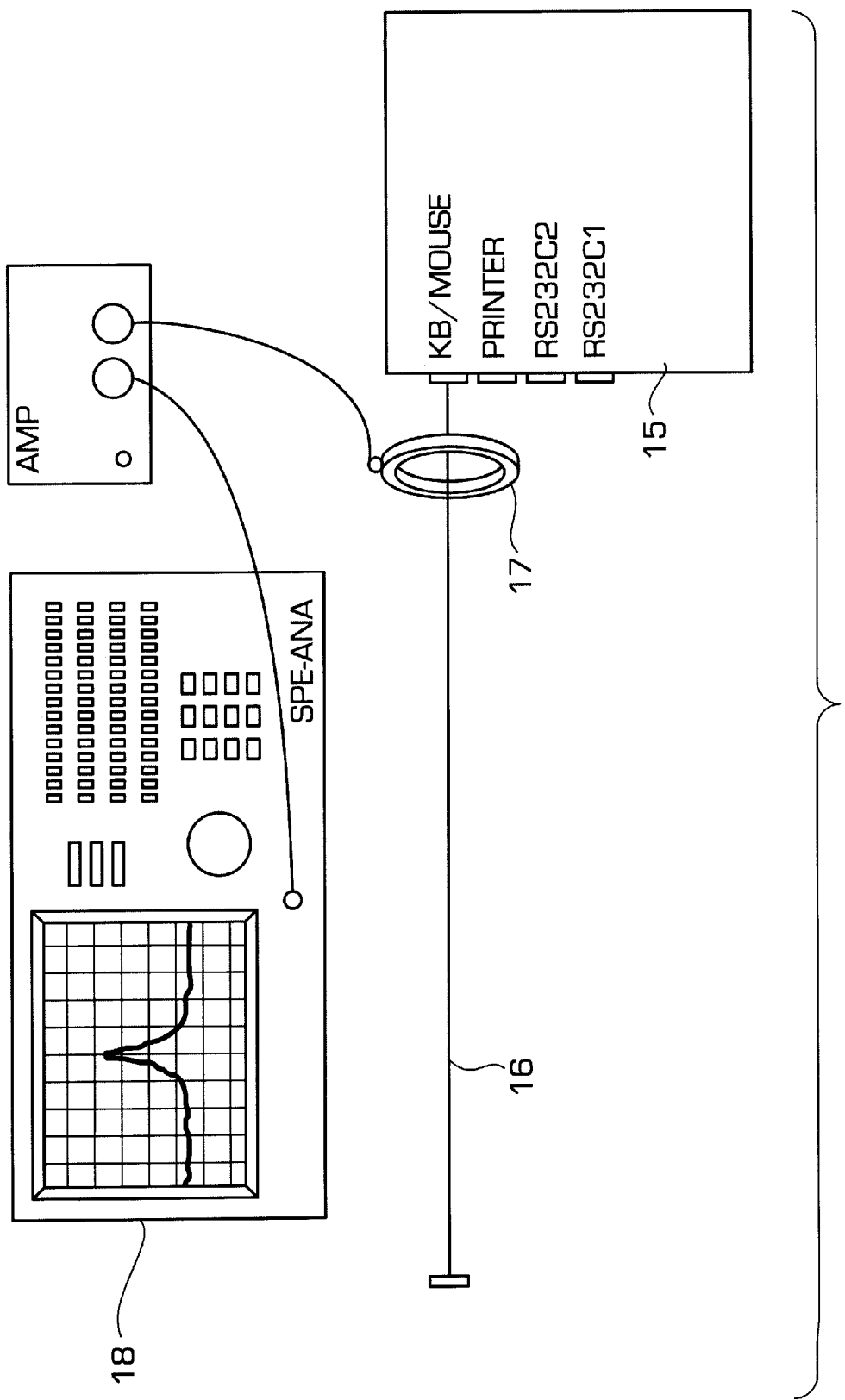
FIG. 17 is a diagram showing a measuring system for measuring a common-mode current which parallelly flows in an interface cable through the I/O connector.
Figure 18B:
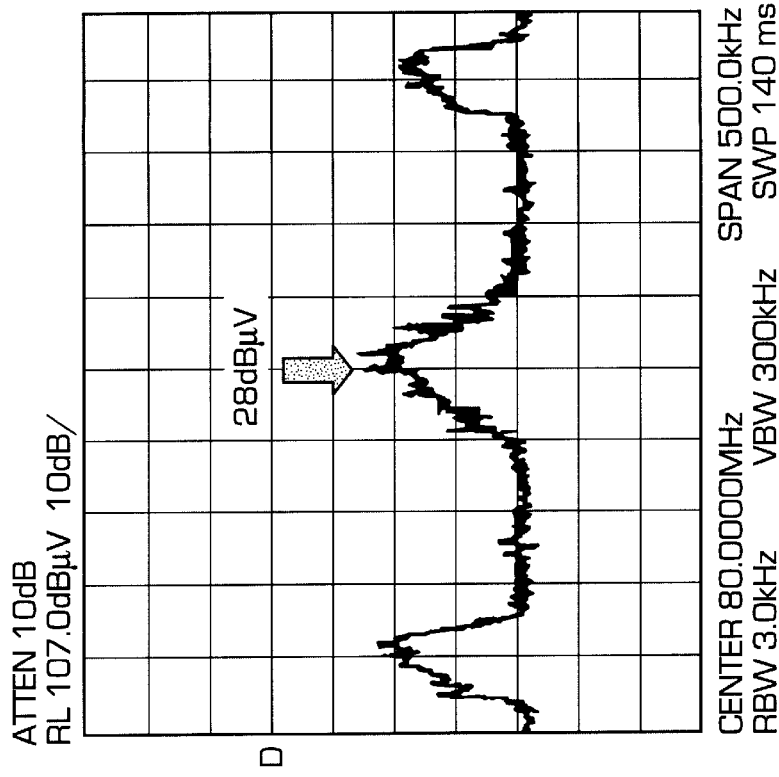
FIG. 18B is a graph showing the measurement result similar to that of FIG. 18A prepared with reference to the embodiment of the printed-wiring board of the present invention.
Figure 18A:
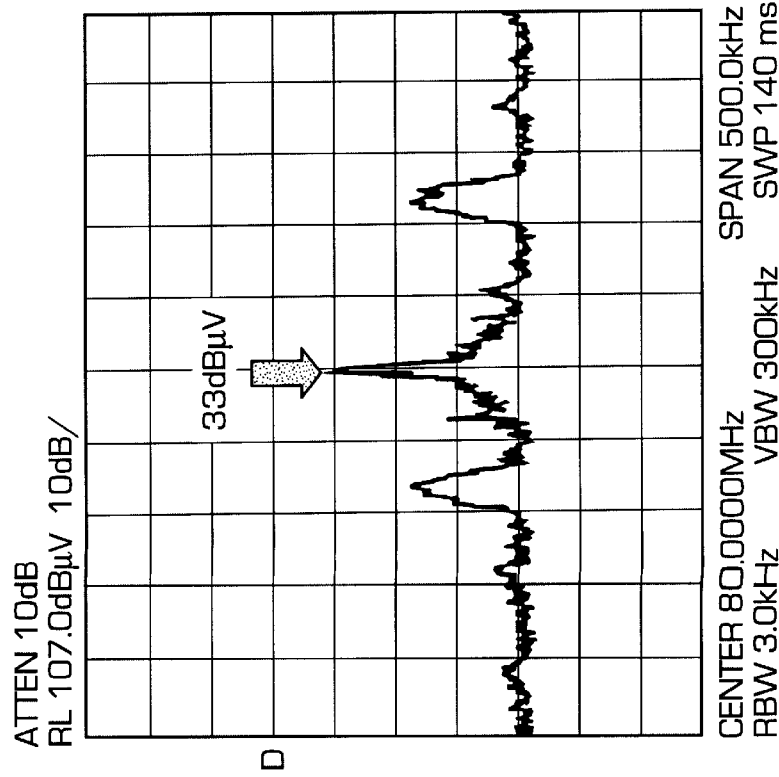
FIG. 18A is a graph showing the measurement result of the common-mode current of I/O connector (RS232C1) of the conventional example of the printed-wiring board.
Figure 19B:
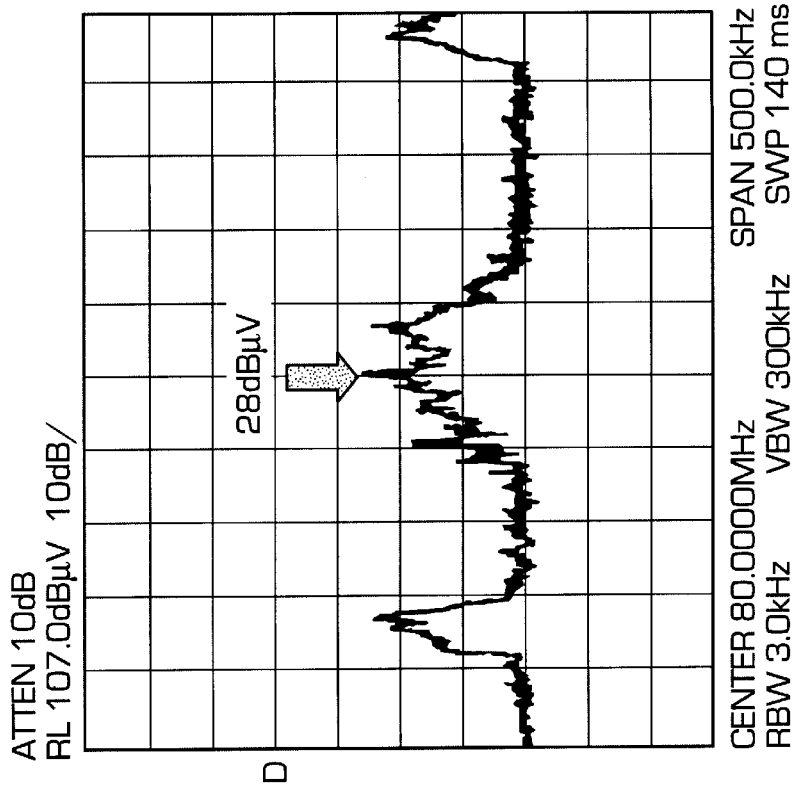
FIG. 19B is a graph showing the measurement result similar to that of FIG. 19A prepared with reference to the embodiment of the printed-wiring board of the present invention.
Figure 19A:
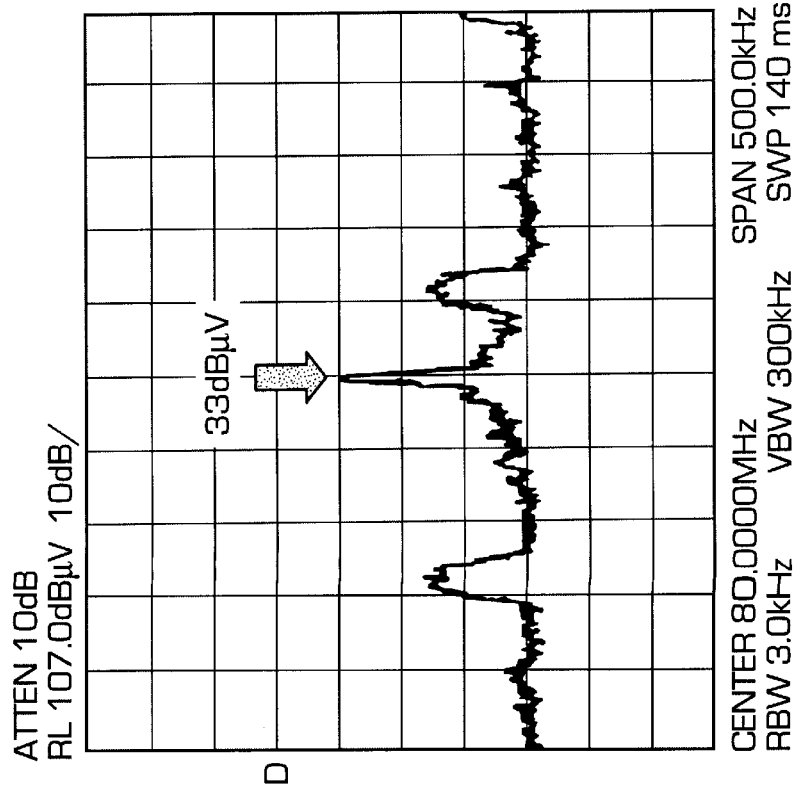
FIG. 19A is a graph showing the measurement result of the common-mode current of I/O connector (RS232C2) of the conventional example of the printed-wiring board.
Figure 20B:
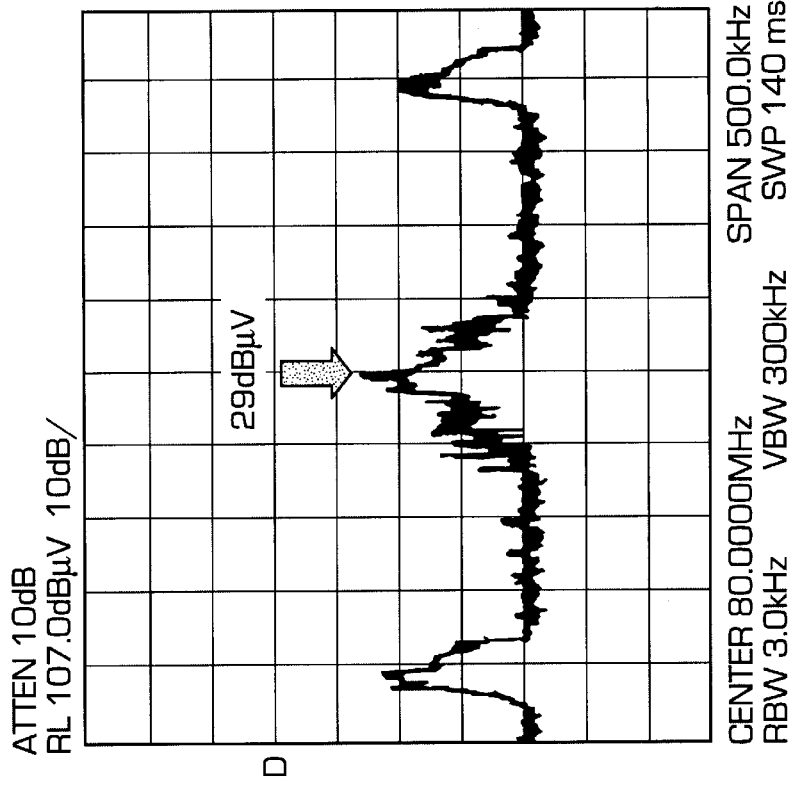
FIG. 20B is a graph showing the measurement result similar to that of FIG. 20A prepared with reference to the embodiment of the printed-wiring board of the present invention.
Figure 20A:
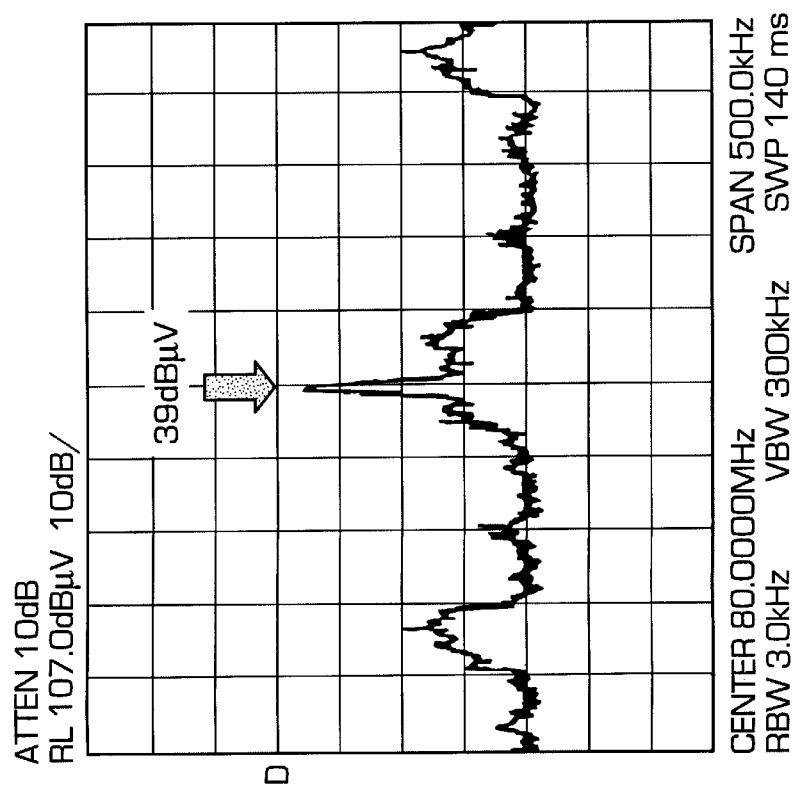
FIG. 20A is a graph showing the measurement result of the common-mode current of the I/O connector (keyboard/mouse) of the conventional example of the printed-wiring board.
Figure 21B:
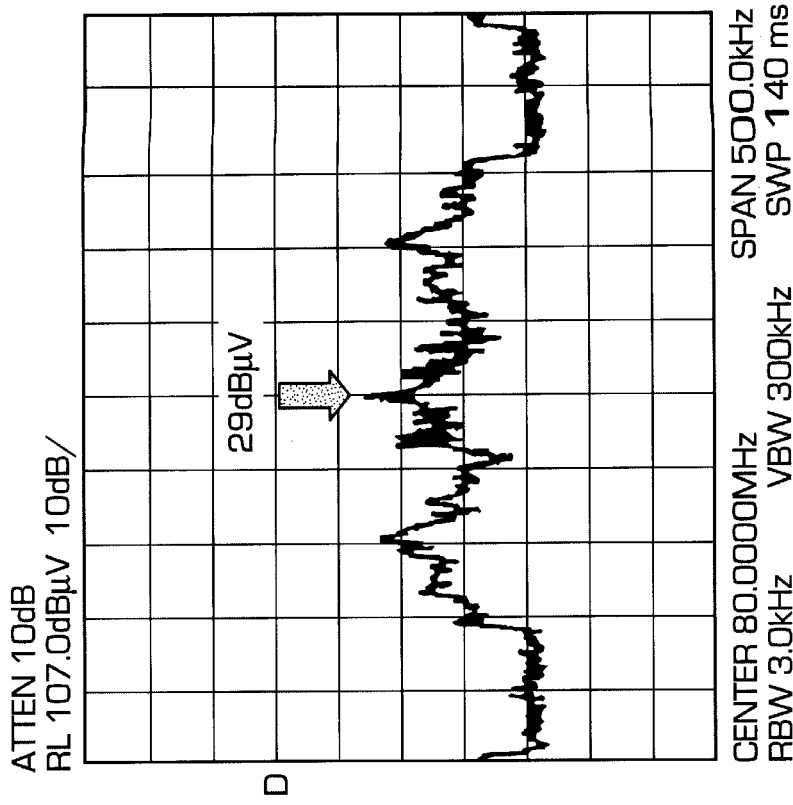
FIG. 21B is a graph showing the measurement result similar to that of FIG. 21A prepared with reference to the embodiment of the printed-wiring board of the present invention.
Figure 21A:
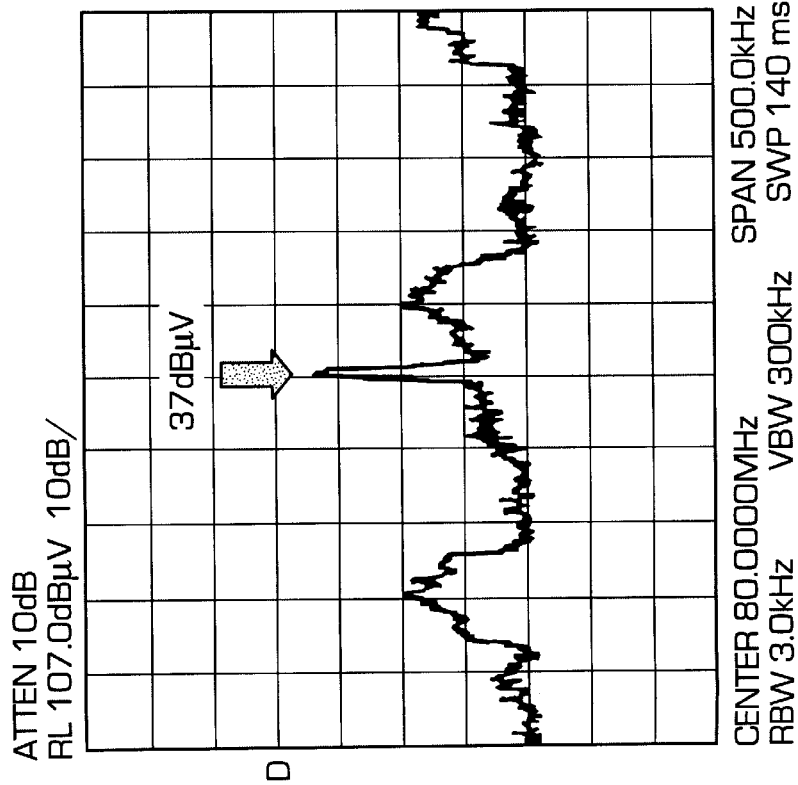
FIG. 21A is a graph showing the measurement result of the common-mode current of the I/O connector (printer) of the conventional example of the printed-wiring board.

At the right side edge of the printed-wiring board which is an object of the present examination, there are provided as shown in FIG. 16, I/O connector (RS232C1) 11 for use as an interface to the outside, ditto (RS232C2) 12, ditto (printer) 13, and ditto (keyboard/mouse) 14. Accordingly, the fact that the diffusion of the high frequency current to the I/O connector portion has decreased, suggests that the current parallelly flows in the interface cable (called as a common-mode current) through the above I/O connectors 11–14 has also decreased. Therefore, in the measuring system shown in FIG. 17, the common-mode current parallelly flowing in the above interface cable 16 from the printed-wiring board 15 is measured by using a current probe 17. The results (current waveforms observed by a spectrum analyzer 18) are shown in FIGS. 18A, 18B, FIGS. 19A, 19B, FIGS. 20A, 20B and FIGS. 21A, 21B (only for 80 MHz). The measured data of the common-mode current are shown in table 2.

The data in FIG. 18A–FIG. 21B are indicated by voltage between the both opposite ends of a terminal resister of probe 17 with unit of dB $\mu$ V.

However, the relationship among the common currents can be recognized from the relationship among the measured data in Table 2.

Further, the high frequency operation of electronic circuits such as the IC, LSI on the printed-wiring board will become stabilized. Consequently, it can contribute to the promotion of high speed clock multimedia equipment. The reason for this is that when a spiral coil inductor which gives high impedance with the high frequency wave and a capacitor which gives low impedance with the high frequency wave are used, if the power source line is viewed from the electronic circuits such as the IC, LSI, the impedance becomes very low thereby making it possible to control the distortion of the signal waveform which may be caused by source voltage fluctuation, while if said electronic circuits are viewed from the common power source line, the impedance becomes very high thereby becoming able to control the wraparound of the high frequency power source current from electronic circuits such as other IC, LSI connected to the common power source line.

Further, the printed-wiring board according to the present invention is excellent in economical efficiency and reliability quality. The reason is that the spiral coil inductor is composed of the inner layer of the printed-wiring board and hence the spiral coil inductor is also manufactured according to a high technique at the same time when the printed-wiring board is manufactured.

TABLE 2

| | RS232C1 Connector | | | RS232C2 Connector | | | Printer Connector | | | KB/Mouse Connector | | |
|---|---|---|---|---|---|---|---|---|---|---|---|---|
| Frequency (MHz) | Conventional Example dB $\mu$ V | Embodiment dB $\mu$ V | Difference dB $\mu$ V | Conventional Example dB $\mu$ V | Embodiment dB $\mu$ V | Difference dB $\mu$ V | Conventional Example dB $\mu$ V | Embodiment dB $\mu$ V | Difference dB $\mu$ V | Conventional Example dB $\mu$ V | Embodiment dB $\mu$ V | Difference dB $\mu$ V |
| 80 | 28 | 33 | −5 | 28 | 33 | −5 | 29 | 37 | −8 | 29 | 39 | −10 |
| 320 | 43 | 52 | −9 | 40 | 47 | −7 | 44 | 50 | −6 | 41 | 48 | −7 |
| 360 | 45 | 41 | 4 | 41 | 42 | −1 | 40 | 42 | −2 | 37 | 42 | −5 |
| 480 | 40 | 54 | −14 | 40 | 54 | −14 | 36 | 51 | −15 | 33 | 54 | −21 |
| 800 | 35 | 43 | −8 | 31 | 33 | −2 | 32 | 44 | −12 | 32 | 41 | −9 |
| 920 | 33 | 49 | −16 | 28 | 46 | −14 | 36 | 45 | −9 | 36 | 45 | −9 |

According to table 2, it is understood that the common-mode current decreases remarkably in the embodiment for all frequencies and connectors except RS232C1 connector with 360 MHz.

As described above, by applying the present invention, the decoupling circuit is strengthened and the electromagnetic radiation noise from the electronic apparatus can largely be controlled.

In the present embodiment, since the spiral coil inductor is structured with the inner layer of the printed-wiring board, no special parts are required to be mounted. Therefore, it can serve as the printed-wiring board of the high density mounting to effectively prevent the generation of the EMC problem.

Further, since the design of the spiral coil inductor of the present invention can be performed together with the design of the wiring by means of a CAD tool for the printed-wiring board, a period for designing and manufacturing is remarkably reduced.

Still further, according to the present invention, since the power source line for each electronic circuit such as the IC, LSI on the printed-wiring board is separated by the large high frequency impedance, the circuit designer can control the high frequency power source current on each of electronic circuits on the printed-wiring board. Therefore, when a designing problem is produced related with the high frequency operation of electronic circuits of this like, it can be settled sooner than ever.

What is claimed is:

1. A printed-wiring board comprising:
   at least one electronic circuit; and
   a substrate for mounting said electronic circuit, wherein said substrate comprises:
   two or more conductor layers;
   a coil inductor composed of a plurality of conductor strips formed by cutting a part of a pair of conductor layers disposed opposite to each other from among said conductor layers, and viaholes connecting said plurality of conductor strips;
   an insulative magnetic material being disposed between said pair of conductor layers facing each other used for composing said coil inductor; and
   wherein a first end of said coil inductor is connected to a power source terminal of said electronic circuit and a second end of said coil inductor is connected to a first power source conductor layer.

2. A printed-wiring board according to claim 1, wherein said insulative magnetic material is disposed in the whole region between said pair of conductor layers disposed opposite to each other.

3. A printed-wiring board according to claim 1, wherein said insulative magnetic material is disposed in only a part of the region between said pair of conductor layers where said plurality of conductor strips are formed.

4. A printed-wiring board according to claim 1, further comprising a capacitor connected between said power source terminal and a ground terminal of said electronic circuit.

5. A printed-wiring board according to claim 1, further comprising a high frequency filter connected between an output terminal of one electronic circuit and an input terminal of another electronic circuit, wherein said coil inductor is used as a composition element of said high frequency filter.

6. A printed-wiring board according to claim 1, wherein said electronic circuit is an IC.

7. A printed-wiring board according to claim 1, wherein said electronic circuit is an LSI.

8. A printed-wiring board according to claim 1, wherein said pair of conductor layers which are used for composing said coil inductor are a part of a ground conductor layer and a part of said first power source conductor layer oppositely disposed to each other.

9. A printed-wiring board according to claim 1, further comprising:
   a second power source conductor layer;
   wherein said first and second power source conductor layers are used as said pair of conductor layers for composing said coil inductor; and
   at least one ground layer outside said pair of conductor layers, respectively.

10. A printed-wiring board according to claim 1 further comprising:
   a first viahole penetrating said pair of conductor layers used for composing said coil inductor while connecting two signal conductor layers; and
   a second viahole connecting two ground conductor layers, being disposed in the proximity of said first viahole.

11. A printed-wiring board according to claim 1, wherein a mixture of a Ni-Zn group ferrite fine powder and an insulation solvent is used as said insulative magnetic material.

12. A printed-wiring board according to claim 1, wherein a mixture of a Mn-Zn group ferrite fine powder and an insulation solvent is used as said insulative magnetic material.

13. A printed-wiring board according to claim 1, wherein a mixture of a SENDUST fine powder and an insulation solvent is used as said insulative magnetic material.

14. A printed-wiring board according to claim 1, wherein a mixture of a Li group ferrite fine powder and an insulation solvent is used as said insulative magnetic material.

15. A printed-wiring board according to claim 11, wherein said insulation solvent is an epoxy group insulation solvent.

16. A printed-wiring board according to claim 12, wherein said insulation solvent is an epoxy group insulation solvent.

17. A printed-wiring board according to claim 13, wherein said insulation solvent is an epoxy group insulation solvent.

18. A printed-wiring board according to claim 14, wherein said insulation solvent is an epoxy group insulation solvent.

19. A printed-wiring board according to claim 1, wherein said insulative magnetic material comprises:
   a magnetic material layer formed of a plurality of magnetic films;
   a first insulation coating applied to an upper surface of said magnetic material layer; and
   a second insulation coating applied to a lower surface of said magnetic material layer.

20. A printed-wiring board according to claim 19, wherein said plurality of magnetic films comprise amorphous magnetic films.

* * * * *